(12) United States Patent
Chia

(10) Patent No.: US 7,768,119 B2
(45) Date of Patent: Aug. 3, 2010

(54) CARRIER STRUCTURE EMBEDDED WITH SEMICONDUCTOR CHIP

(75) Inventor: Kan-Jung Chia, Hsin-feng, Hsinchu (TW)

(73) Assignee: Phoenix Precision Technology Corporation, Hsinchu (TW)

( * ) Notice: Subject to any disclaimer, the term of this patent is extended or adjusted under 35 U.S.C. 154(b) by 332 days.

(21) Appl. No.: 12/000,114

(22) Filed: Dec. 10, 2007

(65) Prior Publication Data
US 2008/0128865 A1 Jun. 5, 2008

(30) Foreign Application Priority Data
Nov. 30, 2006 (TW) .............................. 95144346 A

(51) Int. Cl.
H01L 23/49 (2006.01)
(52) U.S. Cl. ........................ 257/698; 257/753; 257/783; 257/E23.16; 257/E23.127; 257/E21.584; 257/660; 257/679; 257/700; 257/782; 257/E23.064; 257/E23.176; 257/E23.194; 438/118

(58) Field of Classification Search .................. None
See application file for complete search history.

(56) References Cited
U.S. PATENT DOCUMENTS
2006/0237854 A1* 10/2006 Hsu ........................... 257/778
* cited by examiner Primary Examiner—Minh-Loan T Tran
Assistant Examiner—Fei Fei Yeung Lopez
(74) Attorney, Agent, or Firm—Bacon & Thomas, PLLC

(57) ABSTRACT

A carrier structure embedded with semiconductor chips is disclosed, which comprises a core board and a plurality of semiconductor chips mounted therein. The core board comprises two metal plates between which an adhesive material is disposed. An etching stop layer is deposited on the both surfaces of the core board. Pluralities of cavities are formed to penetrate through the core board. The semiconductor chips each have an active surface on which a plurality of electrode pads are disposed, and those are embedded in the cavities and mounted in the core board. An etching groove formed on the core board between the neighboring semiconductor chips is filled with the adhesive material. The present invention avoids the production of metal burrs when the carrier structure is cut.

12 Claims, 6 Drawing Sheets

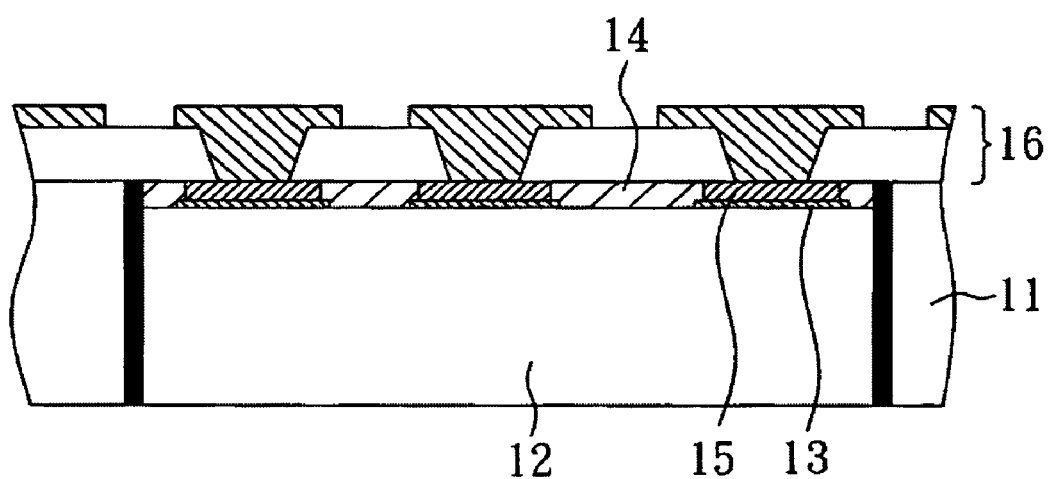
FIG. 1 (Prior arts)

CARRIER STRUCTURE EMBEDDED WITH SEMICONDUCTOR CHIP

BACKGROUND OF THE INVENTION

1. Field of the Invention

The present invention relates to a carrier structure embedded with semiconductor chips and a method for manufacturing the same, and, more particularly, to a carrier structure used to avoid both a warp of the carrier structure due to insufficient rigidity and burr formation when cutting metal, and a method for manufacturing the same.

2. Description of Related Art

Customer demands of the electronics industry continue to evolve rapidly and the main trends are high integration and miniaturization. In order to satisfy those requirements, especially in the packaging of semiconductor devices, development of circuit boards with the maximum of active and passive components and conductive wires has progressed from single to multiple layer types. This means that a greater usable area is available due to interlayer connection technology.

In the conventional semiconductor device, semiconductor chips are mounted on top of a substrate, and then processed in wire bonding, or by connecting the semiconductor chip which has the solder bump thereon to the conductive pads on the substrate, followed by placing solder balls on the back of the substrate to provide electrical connections for the printed circuit board. Although an objective of high quantity pin counts is achieved, this condition is limited by way of long pathways of conductive lines making electric characteristics unable to be improved in the more frequent and high-speed operating situations. Otherwise, the complexity of the manufacture is only relatively increased because too many connective interfaces are required for conventional packages.

In many studies, semiconductor chips directly conducting to external electronic devices are embedded into a package substrate to shorten conductive pathways, decrease signal loss and distortion, and increase abilities of high-speed operation.

In a carrier structure embedded with a semiconductor chip, as shown in FIG. 1, metal layers are added on electrode pads of an active surface of the semiconductor chip for preventing destruction of the semiconductor chip by laser ablating in a carrier. The carrier structure embedded with a semiconductor chip includes: a carrier 11, on which a cavity is formed; a semiconductor chip 12 which is placed in the cavity, and has a plurality of electrode pads 13 formed on an active surface thereof; a passivation layer 14 formed on the surface of the semiconductor chip 12, and accordingly revealing the plural electrode pads 13; plural metal layers 15 formed on surfaces of the electrode pads 13; and a build up circuit layer structure 16 formed on surfaces of the semiconductor chip 12 and the carrier 11. The build up circuit layer structure 16 is formed on the surfaces of the semiconductor chip 12 and the carrier 11, and conducts the carrier 11 to the electrode pads 13 of the semiconductor chip 12.

Currently, in a carrier structure embedded with semiconductor chips, the carrier is generally made of organic resins such as bismaleimide-triazine (BT), and then cut by a cutting tool into predetermined shape. However, stress on the lateral of the build up circuit layer structure and on that of the non-build up structure is not the same. Because the build up circuit layer structure is asymmetric, the carrier becomes warped. Under this condition, production becomes complex, and excessively warped carriers cause low yield and low reliability of products. Alternatively, if the carrier is made of metal, it has better strength for anti-warp than the resin carrier does. However, after the metal carrier is cut by a cutting tool, metal burrs will be generated thereby causing disadvantages such as poor appearance of the carrier structure and damage of the cutting tool. Hence, the requirements have not already been satisfied by the carrier only made of metals or resin.

SUMMARY OF THE INVENTION

In view of the above conventional shortcomings, the present invention provides a carrier structure embedded with semiconductor chips, which comprises a core board comprising two metal plates between which an adhesive material is disposed, wherein an etching stop layer is disposed on the both surfaces of the core board and a plurality of cavities are formed to penetrate through the etching stop layer and the core board; plural semiconductor chips embedded and mounted in the cavities, and each having an active surface on which a plurality of electrode pads are disposed; and at least two etching grooves formed in the corresponding positions of the metal plates between the neighboring semiconductor chips, wherein the etching grooves are filled with the adhesive material.

In the present invention, the semiconductor chips are retained in the cavities of the core board by the adhesive material.

The surface of the etching stop layer, which is unconnected to the etching grooves, can have a metal layer thereon. Preferably, the metal layer is made of Cu, and that can be used to enhance the carrier structure or to manufacture circuits in subsequent processes.

In the carrier structure of the present invention, the material of the etching stop layer disposed on the both surfaces of the metal plates can be the same or different solidified resin. For example, solidified epoxy resin can be used.

Additionally, the adhesive material in the carrier structure embedded with semiconductor chips can be in any form as long as it is fluid under heating. For example, an insulating material or a prepreg material can be used.

According to the carrier structure embedded with semiconductor chips of the present invention illustrated above, a method for manufacturing the same can comprise the following steps, but is not limited thereto.

First, two metal plates respectively laminated with an etching stop layer on one surface thereof are provided. A plurality of first cavities and a plurality of etching grooves are formed in the corresponding positions of the metal plates. A first adhesive layer disposed between the metal plates is provided. Second cavities of the first adhesive layer corresponding to the first cavities of the metal plates are formed. Then, a second adhesive layer is deposited on the surface of the etching stop layer on one of the metal plates. Semiconductor chips each having an active surface and a non-active surface are attached on the surface of the second adhesive layer to retain in the first cavities of the metal plates having the first adhesive layer therebetween. Subsequently, the metal plates facing each other are laminated together. Gaps between the semiconductor chips and the first cavities of the metal plates and the etching grooves are filled with part material of the first adhesive layer. Finally, the second adhesive layer is removed.

In the method of the present invention, the etching grooves each are located between the first cavities. Besides, the etching stop layer is not penetrated by the etching grooves.

In the method of the present invention, the surface of the etching stop layer, which is unconnected to the etching grooves, can have a metal layer formed thereon. Preferably, the metal layer is made of Cu, and that can be used to enhance the carrier structure or to manufacture circuits in subsequent processes.

In the method of the present invention, the first and second cavities are formed through cutting at the same time. Otherwise, the first and second cavities can be the same in size.

In the method of the present invention, the active or non-active surfaces of the semiconductor chips are disposed on the surface of the second adhesive layer so that the semiconductor chips can be mounted in the first cavities of the metal plates having the first adhesive layer therebetween.

When the metal plates and the first adhesive layer are laminated in the present invention, the gaps between the semiconductor chips and the first cavities of the metal plates and the etching grooves are filled with part material of the first adhesive layer under heating so as to fasten the semiconductor chips and to benefit the following manufacturing processes.

Furthermore, during the manufacturing of the carrier structure embedded with semiconductor chips in the present invention, the second adhesive layer can be an adhesive material capable of being easily removed, such as a release film or an adhesive tape. Preferably, the third adhesive layer is a release film.

The metal plates in the present invention can be made of Al, Cu, Fe, or the alloys thereof. Preferably, the metal plates are made of Al. The metal plates are lighter and stronger than organic plates so as to prevent the carrier structure from becoming warped due to insufficient rigidity.

In the present invention, the carrier structure and the method for manufacturing the same can comprise a build up circuit layer structure formed on the surface of the carrier structure and on the active surfaces of the semiconductor chips. The build up circuit layer structure has a plurality of conductive structures therein so as to conduct the semiconductor chips. Besides, conductive pads are formed on the surface of the build up circuit layer structure. In detail, the build up circuit layer structure comprises a dielectric layer, a circuit layer stacked on the dielectric layer, and the conductive structures formed therein. Otherwise, a solder mask can be formed on the surface of the build up circuit layer structure. The solder mask has a plurality of openings formed on the surface thereof so as to reveal the conductive pads of the build up circuit layer structure.

The carrier structure embedded with semiconductor chips illustrated above can be separated along the etching grooves to form a separated carrier structure. The separated carrier structure has one of the semiconductor chips disposed with the build up circuit layer structure thereon, and is surrounded by the adhesive material, i.e. part material of the first adhesive layer in the method for manufacturing the same.

In the above-mentioned openings of the solder mask, conductive elements can be formed to conduct the conductive pads of the build up circuit layer structure. The conductive elements can be solder balls, acicular metals, or conductive adhesive materials.

Accordingly, the carrier structure in the present invention can be formed by way of attaching the metal plates with the adhesive material formed from the first adhesive layer, and that is advantageous for the subsequent manufacturing processes. The carrier structure of the present invention can prevent warps due to the carrier structure being made of organic carriers without sufficient rigidity, and also avoid metal burrs being generated in the edges as occurs when the carrier structure made of metals is cut.

Other objects, advantages, and novel features of the invention will become more apparent from the following detailed description when taken in conjunction with the accompanying drawings.

BRIEF DESCRIPTION OF THE DRAWINGS

FIG. 1 is a cross-sectional view of a conventional carrier structure embedded with semiconductor chips;

DETAILED DESCRIPTION OF THE PREFERRED EMBODIMENT

Figure 2A:
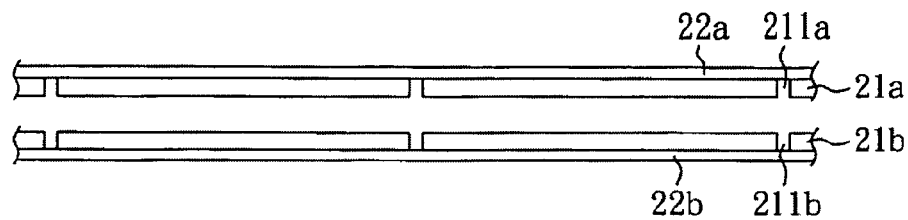
FIGS. 2A to 2E show a flow chart in cross-sectional views for manufacturing a carrier structure embedded with semiconductor chips in the present invention.

Because of the specific embodiments illustrating the practice of the present invention, a person having ordinary skill in the art can easily understand other advantages and efficiency of the present invention through the content disclosed therein. The present invention can also be practiced or applied by other variant embodiments. Many other possible modifications and variations of any detail in the present specification based on different outlooks and applications can be made without departing from the spirit of the invention.

The drawings of the embodiments in the present invention are all simplified charts or views, and only reveal elements relative to the present invention. The elements revealed in the drawings are not necessarily aspects of the practice, and quantity and shape thereof are optionally designed. Further, the design aspect of the elements can be more complex.

Embodiment 1

With reference to FIGS. 2A to 2E, there is shown a flow chart in cross-sectional views for manufacturing a carrier structure embedded with semiconductor chips in the present invention. As shown in FIG. 2A, at first, two metal plates 21a, 21b preferably made of Al are provided, which respectively are laminated with an etching stop layer 22a, 22b on a surface thereof. A plurality of etching grooves 211a, 211b respectively are formed by etching in the corresponding positions of the metal plates 21a, 21b. The etching stop layers 22a, 22b can be a solidified resin. In the present invention, the etching stop layers 22a, 22b are solidified epoxy resin. However, the etching stop layers 22a, 22b can be different solidified resin materials.

Figure 2B:
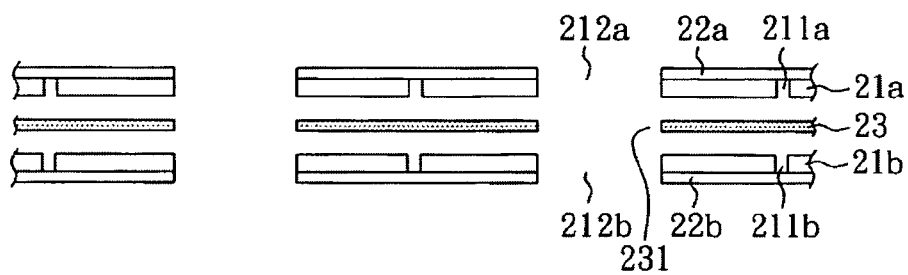

In FIG. 2B, a plurality of first cavities 212a, 212b are formed by cutting the metal plates 21a, 21b having the etching stop layers 22a, 22b. Then, a first adhesive layer 23 is provided. The material of the first adhesive layer 23 is one which can become fluid under heating, such as prepreg material. Besides, second cavities 231 of the first adhesive layer 23 corresponding to the first cavities 212a, 212b of the metal plates 21a, 21b are formed in the first adhesive layer 23 disposed between the metal plates 21a, 21b. Then, the metal plates 21a, 21b and the first adhesive layer 23 are attached together in sequence.

Figure 2C:
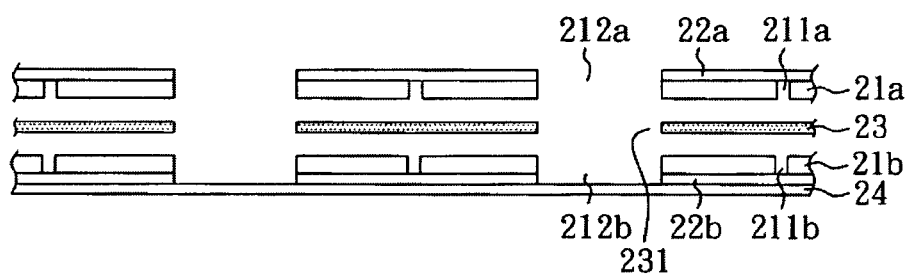

As shown in FIG. 2C, a second adhesive layer 24 is attached on a surface of the etching stop layer 22b of the metal plate 21b. The second adhesive layer 24 has capability of being easily removed. In this embodiment, a release film is used as the present adhesive layer 24.

Figure 2D:
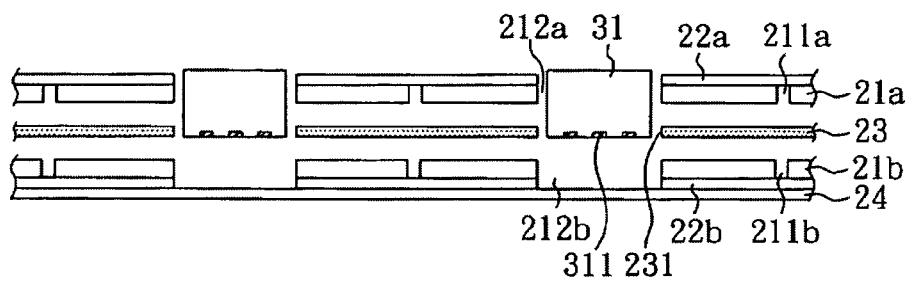

With reference to FIG. 2D, semiconductor chips 31 each have an active surface and a non-active surface are attached on the surface of the second adhesive layer 24 to fix in the first cavities of the metal plates 21a, 21b having the first adhesive layer 23 therebetween. Herein, the semiconductor chips 31 are attached on the surface of the second adhesive layer 24 through the active surfaces thereof. The active surfaces of the semiconductor chips 31 each have a plurality of electrode pads 311 disposed thereon. Besides, these semiconductor chips 31 keep a distance to each other, and are disposed by way of matrix arrangement in the cavities of the carrier structure.

Figure 2E:
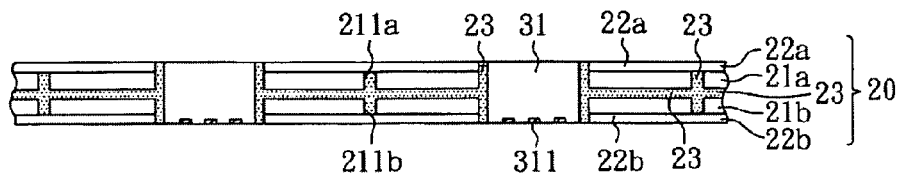

Subsequently, the metal plates 21a, 21b are laminated by facing to each other. Then, gaps between the semiconductor chips and the first cavities 212a, 212b of the metal plates 21a, 21b and the etching grooves 211a, 211b are filled with part adhesive material of the first adhesive layer 23. Therefore, the semiconductor chips can be fastened in the cavities of the carrier structure by means of the adhesive material of the first adhesive layer 23. Besides, the adhesive material filling in the etching grooves 211a, 211b can be advantageous to avoid metal burrs as occurs when the carrier structure are separated to become each separated carrier structure embedded with a single semiconductor chip 31 by subsequent cutting processes. Finally, the second adhesive layer 24 is removed. The carrier structure embedded with semiconductor chips in the present invention is obtained as shown in FIG. 2E. Besides, the metal plates 21a, 21b, the first adhesive 23 disposed between the metal plates 21a, 21b, and the etching stop layers 22a, 22b located on the surfaces of the metal plates 21a, 21b are assembled to become a core board 20a.

Hence, the present invention provides a carrier structure embedded with semiconductor chips as shown in FIG. 2E, which comprises a core board 20a and a plurality of semiconductor chips 31. The core board 20a comprises two metal plates 21a, 21b between which an adhesive material is disposed. An etching stop layer 22a, 22b is disposed on both surfaces of the core board 20a, and pluralities of cavities (i.e. the first cavities 212a, 21b and the second cavities 231 as shown in FIG. 2D) are formed to penetrate through the core board 20a. The semiconductor chips 31 are embedded in the cavities, and fastened in the core board 20a. The semiconductor chips 31 each have an active surface on which pluralities of electrode pads 311 are disposed. In addition, the core board 20a embedded with semiconductor chips 31 has corresponding etching grooves 211a, 211b which are filled with the adhesive material. Furthermore, the adhesive material mentioned above is formed from part material of the first adhesive layer 23 when laminating under heating.

Figure 2F:
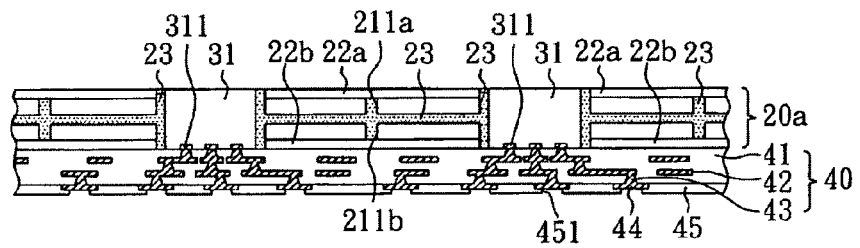
FIGS. 2F to 2H show cross-sectional views for manufacturing a build up structure of the carrier structure embedded with semiconductor chips in the present invention.
Figure 2G:
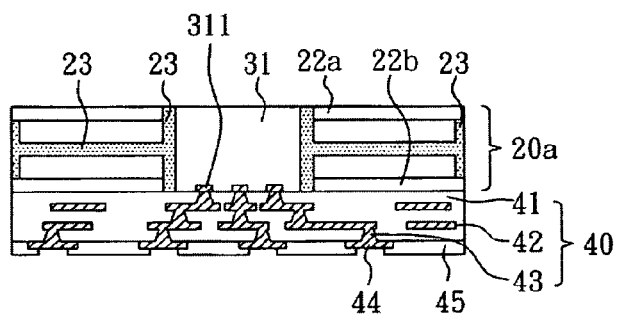
Figure 2H:
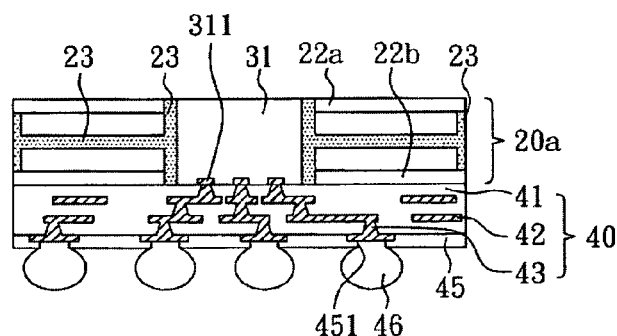

With reference to FIGS. 2F to 2H, there is a flow chart in cross-sectional views for manufacturing a package substrate from the carrier structure embedded with the semiconductor chips illustrated above. As shown in FIG. 2F, through the build up circuit layer technique, a build up circuit layer structure 40 is formed on the active surfaces of the semiconductor chips 31 and on the surface of the carrier structure embedded with the semiconductor chips 31. The build up circuit layer structure 40 can be formed on only one surface or on both surfaces of the carrier structure. Furthermore, the build up circuit layer structure 40 has a dielectric layer 41, a circuit layer 42, and conductive vias 43. The circuit layer 42 is stacked on the dielectric layer 41, and that is formed by exposure and development of a resistive layer (figures not shown) and then plating. The conductive vias 43 are formed as follows: vias (figures not shown) are formed through laser drilling the dielectric layer 41, and at the same time of plating the circuit layer 42, the conductive vias 43 are also formed through plating. Besides, the conductive vias 43 connect to the electrode pads 311 of the semiconductor chips 31. Pluralities of pads 44 are formed on the surface of the build up structure 40. In addition, a solder mask 45 is formed on the outer surface of the build up circuit layer structure 40. The solder mask 45 has a plurality of openings 451 so as to reveal the pads 44 of the build up circuit layer structure 40.

Through cutting along the etching grooves 211a, 211b, the carrier structure disposed with the build up circuit layer structure 40 thereon is separated to form a separated carrier structure as shown in FIG. 2G. Besides, part of the adhesive material of the first adhesive layer 23 is retained surrounding the separated carrier structure having the single semiconductor chip 31 embedded in the core board 20a after separation.

Finally, as shown in FIG. 2H, conductive elements 46 such as solder balls conducting the pads 44 are formed in the openings 451 of the solder mask 45 on the surface of the separated carrier structure having the single semiconductor chip 31. The conductive elements 46 can also be metal bumps or other conductive adhesive materials.

Embodiment 2

Figure 3A:
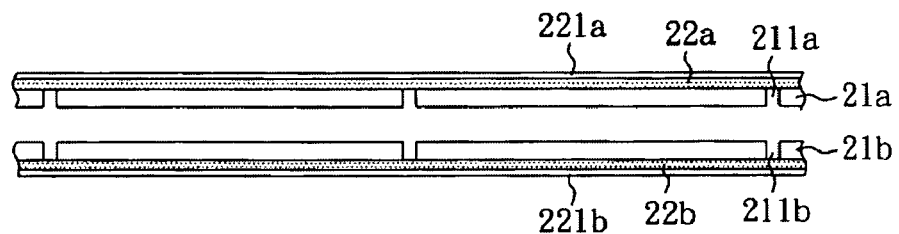
FIGS. 3A to 3B show a flow chart in cross-sectional views for manufacturing a carrier structure embedded with semiconductor chips in the present invention.
Figure 3B:
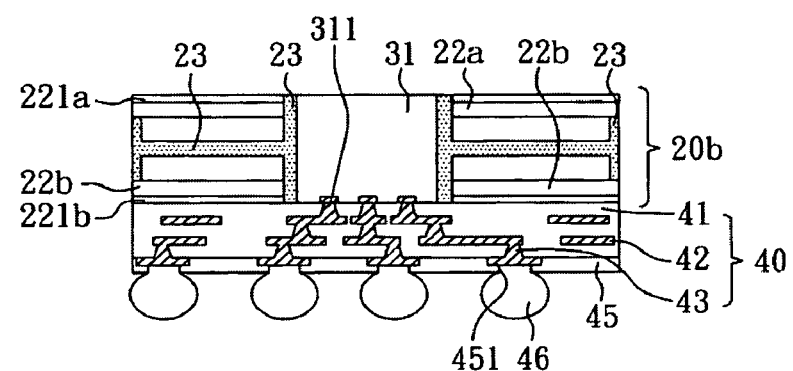

With reference to FIGS. 3A and 3B, there are carrier structures embedded with semiconductor chips in cross-sectional view in the present embodiment. As shown in FIG. 3A, the present embodiment is approximately similar to Embodiment 1 except that the surfaces of the etching stop layers 22a and 22b, which are unconnected to the etching grooves, each have a Cu layer 221a, 221b thereon. Other steps of the present embodiment are the same as those of Embodiment 1. Hence, the separated carrier structure having a single semiconductor chip 31 after separation as shown in FIG. 3B can be afforded. The Cu layers 221a and 221b disposed on the surfaces of the etching stop layers 22a and 22b, respectively, are used to enhance the structure of the core board 20b, and those also can be manufactured as circuits in other build up circuit layer structures (figures not shown) by subsequent processes.

Embodiment 3

Figure 4A:
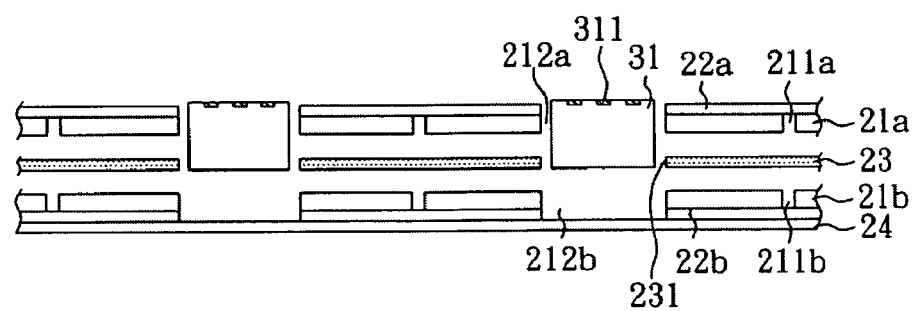
FIGS. 4A to 4B show a flow chart in cross-sectional views for manufacturing a carrier structure embedded with semiconductor chips in the present invention.
Figure 4B:
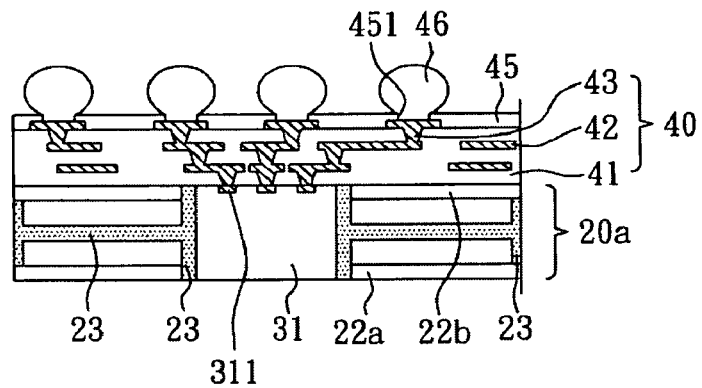

With reference to FIGS. 4A and 4B, there are carrier structures embedded with semiconductor chips in cross-sectional view in the present embodiment. As shown in FIG. 4A, the present embodiment is approximately similar to Embodiment 1 except that the non-active surfaces of the semiconductor chips 31 face to the second adhesive layer 24 and the semiconductor chips 31 are temporarily adhered on the surface of the second adhesive layer 24. Other steps of the present embodiment are the same as those of Embodiment 1. Hence, the separated carrier structure having a single semiconductor chip 31 after separation as shown in FIG. 4B can be afforded.

Embodiment 4

Figure 5A:
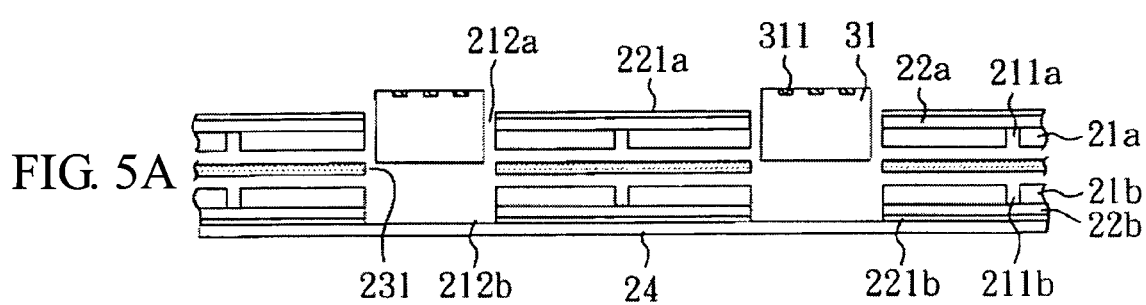
FIGS. 5A to 5B show a flow chart in cross-sectional views for manufacturing a carrier structure embedded with semiconductor chips in the present invention.
Figure 5B:
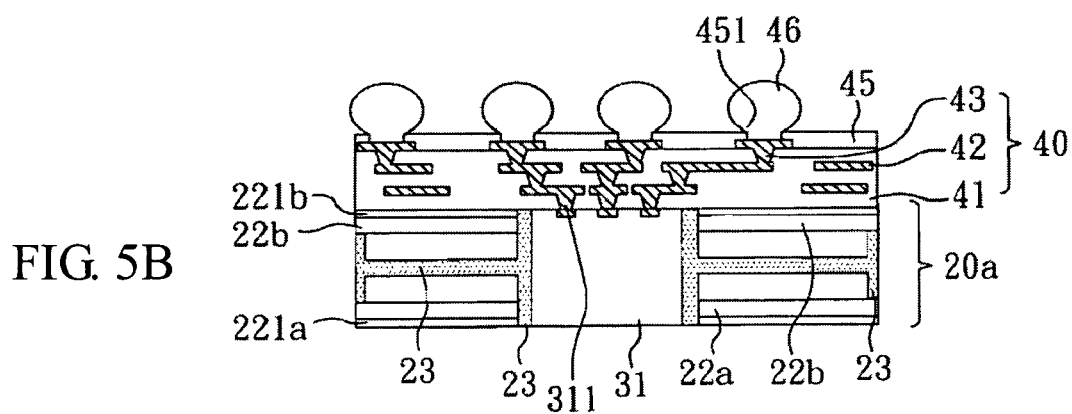

With reference to FIGS. 5A and 5B, there are carrier structures embedded with semiconductor chips in cross-sectional view in the present embodiment. As shown in FIG. 5A, the present embodiment is approximately similar to Embodiment 2 except that the non-active surfaces of the semiconductor chips 31 face to the second adhesive layer 24 and the semiconductor chips 31 are temporarily adhered on the surface of the second adhesive layer 24. Other steps of the present embodiment are the same as those of Embodiment 2. Hence, the separated carrier structure having a single semiconductor chip 31 after separation as shown in FIG. 5B can be afforded.

In conclusion, in the present invention, the metal plate and the adhesive material of the first adhesive layer are used so that the etching grooves can be filled with the adhesive material to fasten the semiconductor chips. Through cutting along the etching grooves, the carrier structure is separated into each separated carrier structure having a single semiconductor chip. Therefore, the disadvantages, such as warps due to the carrier structure being made of organic carriers and metal burrs being generated because the carrier structure is made of metal plates can be avoided so as to benefit the subsequent manufacturing processes.

Although the present invention has been explained in relation to its preferred embodiment, it is to be understood that many other possible modifications and variations can be made without departing from the scope of the invention as hereinafter claimed.

What is claimed is:

1. A carrier structure embedded with semiconductor chips comprising:
    a core board comprising two metal plates between which an adhesive material is disposed, wherein an etching stop layer is disposed on the both surfaces of the core board and a plurality of cavities are formed to penetrate through the etching stop layer and the core board;
    a plurality of semiconductor chips embedded and mounted in the cavities, and each having an active surface on which a plurality of electrode pads are disposed; and
    at least two etching grooves formed in the corresponding positions of the metal plates between the neighboring semiconductor chips, wherein the etching grooves are filled with the adhesive material.

2. The carrier structure as claimed in claim 1, wherein the semiconductor chips are mounted in the cavities by the adhesive material.

3. The carrier structure as claimed in claim 1, wherein the surface of the etching stop layer, which is unconnected to the etching grooves, has a Cu layer thereon.

4. The carrier structure as claimed in claim 1, wherein the metal plates are made of Al, Cu, Fe, or the alloy thereof.

5. The carrier structure as claimed in claim 1, wherein the material of the etching stop layer disposed on the both surfaces of the core board is the same or different.

6. The carrier structure as claimed in claim 1, wherein the adhesive material is an insulating material or a prepreg material.

7. The carrier structure as claimed in claim 1, further comprising a build up circuit layer structure formed on the surface of the carrier structure and on the active surfaces of the semiconductor chips, wherein the build up circuit layer structure has a plurality of conductive structures therein so as to conduct the semiconductor chips, and has conductive pads formed on the surface thereof.

8. The carrier structure as claimed in claim 7, wherein the build up circuit layer structure comprises a dielectric layer, a circuit layer stacked on the dielectric layer, and the conductive structures formed in the dielectric layer and connecting to the circuit layer.

9. The carrier structure as claimed in claim 7, further comprising a solder mask formed on the surface of the build up circuit layer structure, wherein the solder mask has a plurality of openings formed on the surface thereof so as to reveal the conductive pads of the build up circuit layer structure.

10. A separated carrier structure embedded with a single semiconductor chip, which is formed by separating a carrier structure, wherein the carrier structure comprises:
    a core board comprising two metal plates between which an adhesive material is disposed, wherein an etching stop layer is disposed on the both surfaces of the core board and a plurality of cavities are formed to penetrate through the etching stop layer and the core board;
    a plurality of semiconductor chips embedded and mounted in the cavities, and each having an active surface on which a plurality of electrode pads are disposed;
    at least two etching grooves formed in the corresponding positions of the metal plates between the neighboring semiconductor chips, wherein the etching grooves are filled with the adhesive material;
    a build up circuit layer structure formed on the surface of the carrier structure and on the active surfaces of the semiconductor chips, wherein the build up circuit layer structure has a plurality of conductive structures therein so as to conduct the semiconductor chips, and has conductive pads formed on the surface thereof; and
    a solder mask formed on the surface of the build up circuit layer structure, wherein the solder mask has a plurality of openings formed on the surface thereof so as to reveal the conductive pads of the build up circuit layer structure,
    wherein the carrier structure is separated by the etching grooves so as to form the separated carrier structure which is surrounded by the adhesive material.

11. The separated carrier structure as claimed in claim 10, further comprising conductive elements formed in the openings of the solder mask and conducting the conductive pads.

12. The separated carrier structure as claimed in claim 11, wherein the conductive elements are solder balls, acicular metals, or conductive adhesive materials.

* * * * *